United States Patent [19]
Guo et al.

[11] Patent Number: 6,005,432
[45] Date of Patent: Dec. 21, 1999

[54] VOLTAGE LEVEL SHIFT SYSTEM AND METHOD

[75] Inventors: Xiaoyi Guo, Santa Clara; Nalini Ranjan, San Jose, both of Calif.

[73] Assignee: S3 Incorporated, Santa Clara, Calif.

[21] Appl. No.: 09/053,555

[22] Filed: Apr. 1, 1998

[51] Int. Cl.$^6$ .................................................... G06F 5/00
[52] U.S. Cl. ..................... 327/333; 327/108; 327/199; 326/62; 326/83
[58] Field of Search ..................................... 327/333, 437, 327/199, 206, 207, 208, 223, 108, 112; 326/62, 63, 80–83

[56] References Cited

U.S. PATENT DOCUMENTS

| | | | |
|---|---|---|---|
| 3,921,010 | 11/1975 | Griffin | 327/58 |
| 4,743,862 | 5/1988 | Scheinberg | 330/277 |
| 5,111,064 | 5/1992 | Ward | 327/108 |
| 5,764,077 | 6/1998 | Andresen et al. | 326/34 |
| 5,926,056 | 7/1999 | Morris | 327/333 |

*Primary Examiner*—Timothy P. Callahan
*Assistant Examiner*—An T. Luu

*Attorney, Agent, or Firm*—Fenwick & West

[57] ABSTRACT

A voltage level shift system transitions a voltage signal between two components and includes a first inverter, a signal pass subsystem, a pull-up transistor, a second inverter, and a third inverter. The first inverter is coupled to the signal pass subsystem. The signal pass subsystem is coupled to the pull-up transistor, the second inverter, and the third inverter. The signal pass subsystem includes a first passgate and a second passgate. When an input voltage transitions from a logic low to a logic high, the first inverter inverts the logic high input signal to a logic low and passes this signal through the passgate subsystem. The second inverter receives the logic low signal and immediately inverts it to transition the output signal from a low logic to a logic high. The logic high output signal, turns off the pull-up transistor. When the input signal transitions from a logic high to a logic low, the first inverter receives the signal and generates a logic low signal that passes through the passgate subsystem. The second inverter receives the logic low signal and immediately inverts it to transition the output signal from a logic high to a logic low. The logic low signal places the pull-up transistor in an on state to turn off the p-device in the circuit. A method for transitioning a voltage signal between two components is also disclosed.

25 Claims, 7 Drawing Sheets

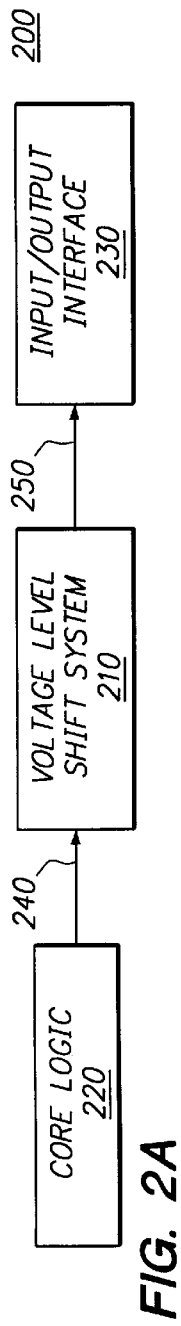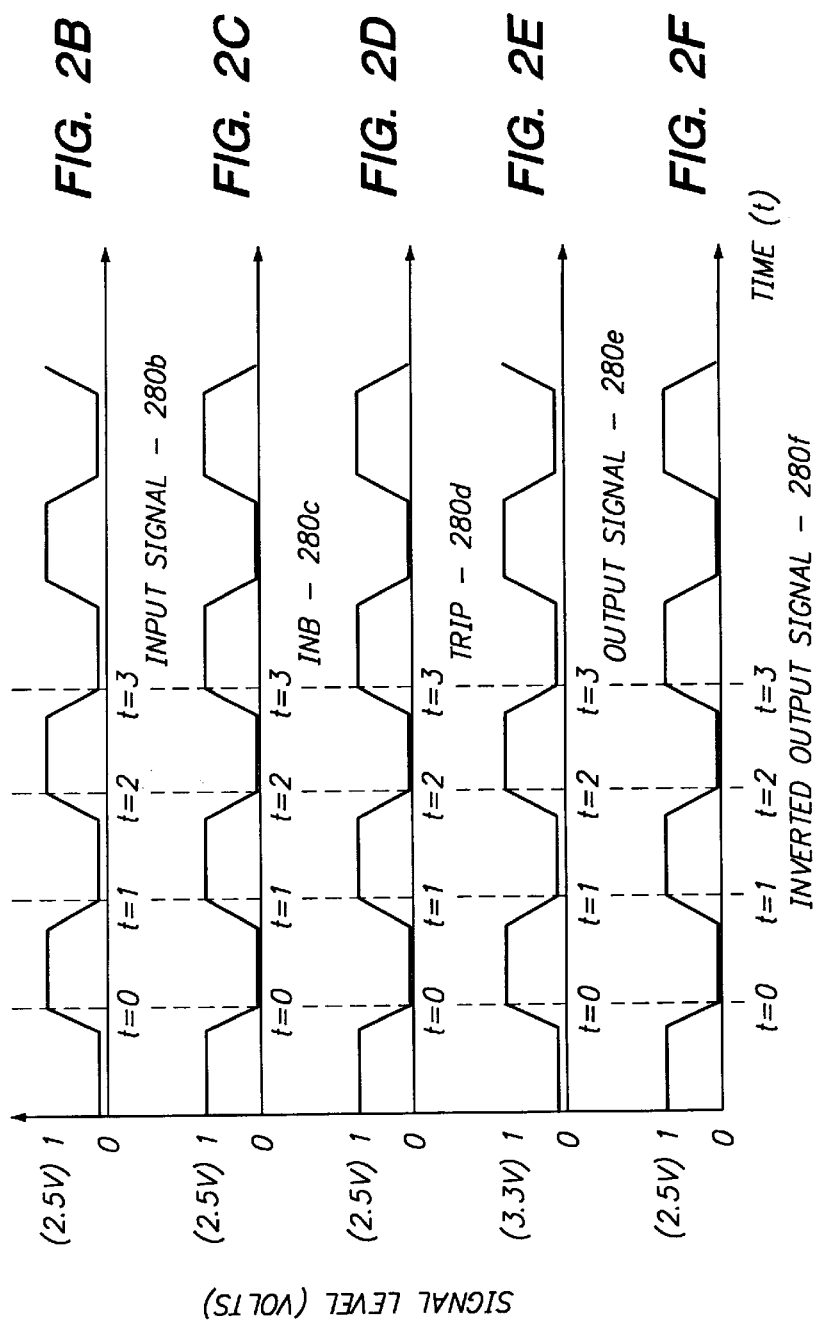

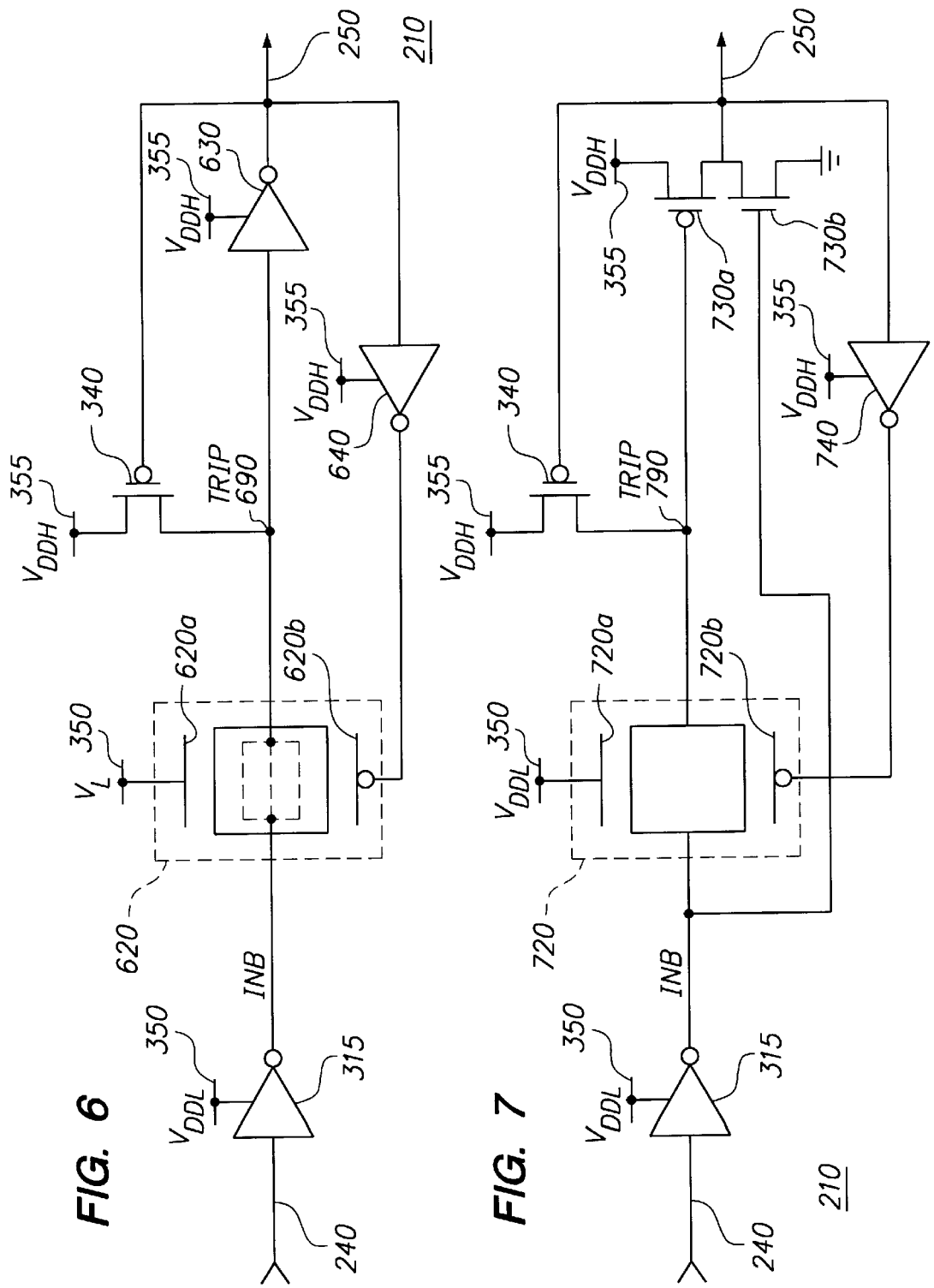

VOLTAGE LEVEL SHIFT SYSTEM AND METHOD

BACKGROUND OF THE INVENTION

1. Field of the Invention

The present invention relates to a voltage level shift system and method, and more particularly, to a voltage level shift system and method between a core device and a peripheral device.

2. Description of the Related Art

Conventional voltage level shift circuits for use between a core power supply and an input/output ("I/O") portion in a microchip are known. Conventional voltage level shift circuits shift a voltage signal from a lower voltage level at the core power supply, e.g., 2.5 volts, to a higher voltage level necessary for the I/O portion of the microchip.

FIG. 1 illustrates a conventional voltage level shift circuit 10. The conventional voltage level shift circuit 10 includes an input signal line 12, a first inverter 15, a n-channel metal-oxide semiconductor field-effect transistor ("MOSFET") 20, a second inverter 25 a p-channel pull-up transistor 30, a low voltage supply rail 35, a high voltage supply rail 40, and an output signal line 42. The low voltage supply rail has a voltage of $V_{DDL}$=2.5 volts and the high voltage supply rail 40 has a voltage $V_{DDH}$=3.3 volts.

The input signal line 12 is coupled to the core power supply (not shown) and the first inverter 15. The first inverter 15 is coupled to the low voltage supply line 35 and the n-channel MOSFET 20. The n-channel MOSFET is coupled to the low voltage supply line 35, a drain of the p-channel pull-up transistor 30, and the second inverter 25. A source of the p-channel pull-up transistor 30 is coupled to the high voltage supply line 40 and a gate of the pull-up transistor 30 is coupled to the output signal line 42. The second inverter 25 is coupled to the high voltage supply line 40 and the output signal line 42.

When the conventional voltage level shift circuit 10 receives a voltage signal that transitions from a high voltage to a low voltage (e.g., 2.5 volts to 0 volts) from the core power supply, the input voltage signal is inverted to a logic high by the first inverter 15 to a voltage of 2.5 volts. The 2.5 volt signal is passed by the n-channel MOSFET 20 to the second inverter 25.

The n-channel MOSFET 20, however, reduces the voltage signal by a threshold voltage, $V_T$=0.7 volts, so that the second inverter 25 receives only a $(V_{DDL})-(V_T)$=1.2 volt signal (2.5 volts $(V_{DDL})$–0.7 volts $(V_T)$). The second inverter 25 must wait for the p-channel pull-up transistor 30 to pull the voltage level up to VDDH=3.3. volts, and the triggering signal for the second inverter 25 will not be more than $(V_{DDL})-(V_T)$ volts. Therefore, the voltage signal transition from a logic high to a logic low in conventional voltage level shift circuits 10 will have more delays than a transition from a logic low to a logic high.

Thus, conventional voltage level circuits 10 are not suitable for low-input voltage applications because the voltage drop through the n-channel MOSFET 20 is too large to allow the second inverter 25 to invert the voltage signal to trigger transitions between low and high in a timely manner. That is, the time required to pull-up the voltage to an adequate level that allows the second inverter 25 to invert the signal adds delays to the operation of the circuit. These delays slow down overall circuit performance and result in decreased overall system performance. Moreover, conventional voltage level shift circuits 10 require greater system resources, for example, a greater power draw to accommodate for the need to raise voltage levels to a level that is necessary to properly perform functions such as properly transitioning between logic lows and highs in a timely manner.

Therefore, there is a need for a voltage level shift system and method that allows for signal transitions between two signal levels in a manner that increases overall system performance with less power consumption.

SUMMARY OF THE INVENTION

A voltage level shift system allows for fast, efficient, and proper voltage level transition between two components in a signal processing system. In one embodiment, the voltage level shift system includes a first inverter, a signal pass subsystem having an inverted gate, a drain, and a source, a weak pull-up transistor, a second inverter, and a third inverter. The first inverter is coupled to receive an input signal along an input signal line. The first inverter is also coupled to the signal pass subsystem. The signal pass subsystem is coupled to the drain of the weak pull-up transistor, the second inverter, and the third inverter. The second inverter is coupled to third inverter and the weak pull-up transistor and is coupled to produce an output signal along an output signal line. The source of the weak pull-up transistor is coupled to a voltage high supply rail, $V_{DDH}$, which may be 3.3 volts.

The signal pass subsystem includes a first passgate and a second passgate. In one embodiment, each passgate is a n-channel metal oxide field effect transistors ("MOSFET") having a gate, a drain, and a source. The drains and the sources of the two passgates are coupled together. The drains of the two passgates are coupled to an output of the first inverter. The sources of the two passgates are coupled to an input of the second inverter. An output of the second inverter is coupled to the gate of the first passgate, an input of the third inverter, and the output signal line. An input of the third inverter is coupled to the gate of the second passgate.

Generally, the voltage level shift system uses the transitions, e.g., logic high to logic low or vice versa, of a voltage input signal (0 volts at a logic low and 2.5 volts at a logic high) to produce an voltage output signal that may have a higher voltage level (3.3 volts) at a logic high. It is noted that the voltage level shift system may be initialized for operation with the input signal and the output signal starting at a logic low with a transition to a logic high or vice versa.

As an example, with the input signal initially at a logic high and the output signal initially also at a logic high, the first passgate of the passgate subsystem is in an ON, or enabled, state because its gate is enabled by the logic high signal along the output signal line. The second passgate of the passgate subsystem creates an open circuit because its gate is disabled upon receiving a logic low signal from the third inverter, which received the logic high output signal. In addition, the pull-up transistor is in an OFF, or disabled, state because the inverted gate receives the logic high output signal.

When the input signal transitions from a logic high to a logic low along the input signal line, the output signal along the output signal line subsequently also transitions from a logic high to a logic low. Specifically, the first inverter receives the logic low input signal and generates an inverted signal that is a logic high signal. The inverted signal passes through the first passgate because the gate of the first passgate continues to receive a logic high output signal at this time.

Similarly, the weak pull-up transistor is in an OFF state because its inverted gate receives the logic high output signal at this time. The inverted signal is input into the second inverter. The second inverter inverts the inverted signal to generate a logic low output signal that is output along the output signal line. Thus, the output signal has also transitioned from a logic high to a logic low after the input signal transitioned from a logic high to a logic low.

The logic low output signal from the second inverter is also received by the third inverter, the inverted gate of the pull-up transistor, and the gate of the first passgate. The logic low output signal received at the gate of the first passgate switches the first passgate from an ON state to an OFF state that effectively creates an open circuit. The third inverter receives and inverts the logic low output signal to produce a logic high signal. The logic high signal is received by the gate of the second passgate. The second passgate switches from an OFF state to an ON state. Similarly, the inverted gate of the pull-up transistor receives the logic low output signal to switch the pull-up transistor from an OFF state to an ON state.

The weak pull-up transistor, which is in the ON state, pulls a trip node to the high voltage rail voltage, $V_{DDH}$, and completely turns off a p-device within the second inverter so that the second inverter does not draw DC current. By not drawing DC current, the system saves power because the signal received by the second inverter is at a voltage of $V_{DDH}$ rather than $(V_{DDH})-(V_T)$. Thus, the second inverter can immediately generate a logic high output signal along the output signal line.

When the input signal transitions from the logic low to the logic high, the voltage level shift system subsequently transitions the output signal from the logic low to the logic high. Specifically, logic high input signal is received and inverted by the first inverter that generates an inverted signal that is a logic low signal. The inverted signal is passed by the second passgate and input into the second inverter and, in turn, produces a logic high signal from the second inverter.

The logic high output signal is also received by the inverted gate of the pull-up transistor, the gate of the first passgate, and the third inverter. The first passgate switches from an OFF state back to an ON state. The inverted gate switches the pull-up transistor from an ON state back to an OFF state. The third inverter inverts the logic high output signal and produces a logic low signal that switches the second passgate from an ON state back to an OFF state.

When the input signal transitions back from a logic high to a logic low, the voltage level shift system operates as described above with respect to the transition from logic high to logic low. The voltage level shift system transitions an output signal between a logic high and a logic low and vice versa as described as an input signal transitions between a logic high and a logic low and vice versa.

Another embodiment of the voltage level shift system includes a signal pass subsystem, a pull-up device, a pull-down device, an inverter, and a weak pull-up transistor. The signal pass subsystem is coupled to receive an input signal. The signal pass system is also is coupled to the weak pull-up transistor, the inverter, the pull-up device, the pull-down device, and the output signal line. The inverter is coupled to the pull-up device and the pull-down device, which is coupled to a voltage source that may be 0 volts. The output signal line is coupled to the signal pass system, the weak pull-up transistor, the pull-up device, the pull-down device, and the inverter.

The signal pass subsystem includes a first passgate and a second passgate. The second passgate is coupled to the inverter. The pull-up device may be a p-channel pull-up transistor and the pull-down device maybe an n-channel pull-down transistor.

In this embodiment of the voltage level shift system, consider, for example, that the output signal is initially at a logic high and that the input signal is initially at a logic low. The output signal transitions from the logic high to a logic low when the input signal transitions from a logic low to a logic high. For example, initially, if the first passgate is in an ON state, the second passgate is in an OFF state, and the weak pull-up transistor is in an OFF state.

The logic high input signal is received and passed through the first passgate. The passed logic high input signal is received by the p-channel pull-up transistor which turns to an OFF state. The logic high input signal is also received by the n-channel pull-down transistor which turns to an ON state. With the p-channel pull-up transistor in the OFF state and the n-channel pull-down transistor in the ON state, the output signal transitions from logic high to a logic low along the output signal line.

Once the output signal transitions from the logic high to the logic low, the weak pull-up transistor turns to an ON state and pulls a trip node to the voltage high supply rail voltage so that the p-channel pull-up transistor is shut off. In addition, the first passgate turns to an OFF state and the second passgate turns to an ON state. The second passgate is in the ON state because the logic low output signal is inverted by the inverter to produce a logic high signal at the second passgate. When the input signal transitions from a logic high to a logic low, the logic low input signal passes through the second passgate to the p-channel pull-up transistor. The p-channel pull-up transistor is placed in an ON state. The logic low input signal is also received at the n-channel pull-down transistor, which is then placed in an OFF state.

With the p-channel pull-up transistor in the ON state, the n-channel pull-down transistor in the OFF state, and the weak pull-up transistor in the OFF state, the output signal transitions from the logic low to a logic high along the output signal line. The voltage level shift system continues by transitioning the output signal from the logic high to the logic low when the input signal transitions from the logic low to the logic high.

The voltage level shift system of the present invention beneficially includes a signal pass subsystem to facilitate signal transitions between a logic high and a logic low between two components, e.g., a core logic component and an input/output interface. By eliminating delays for inverters to invert a signal from, for example, a logic low to a logic high, the present invention advantageously provides for faster switching times between the two signal levels. Faster switching times between logic highs and logic lows increases overall microchip speed.

Further, because a voltage level build-up necessary for switching is eliminated, the microchip consumes less power, and therefore, is beneficial for low power system and circuit applications. Moreover, the present invention also beneficially provides balanced rise and fall delay times, i.e., the rise and fall delays are equal, therefore also increasing overall system efficiency.

The features and advantages describes in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

BRIEF DESCRIPTION OF THE DRAWINGS

FIG. 2a illustrates one embodiment of a signal processing system in accordance with the present invention;

FIGS. 2b–2f are timing diagrams for signals in a voltage level shift system in accordance with the present invention;

FIG. 6 illustrates a third embodiment of a voltage level shift system in accordance with the present invention;

FIG. 7 illustrates a fourth embodiment of a voltage level shift system in accordance with the present invention.

DETAILED DESCRIPTION OF THE PREFERRED EMBODIMENTS

A present invention includes a voltage level shift system for use in transitioning a voltage level between, for example, logic components of a microchip and an input/output interface.

FIG. 2a is a block diagram illustrating one embodiment of a signal processing system 200 in accordance with the present invention. The signal processing system 200 includes a core logic component 220, a voltage level shift system 210, and an input/output interface 230. The core logic component 220 is coupled through signal line 240 to the voltage level shift system 210. The voltage level shift system 210 is coupled through signal line 250 to the input/output interface 230.

The voltage level shift system 210 allows for fast, efficient, and proper voltage level transition between any two components of a signal processing system, for example, the core logic component 220 and the input/output interface 230. It is noted that the core logic component 220 may be the core logic structure of a microchip, for example. The input/output interface 230 may be an input/output interface of an input/output peripheral, for example.

FIG. 2b is a logic waveform diagram illustrating a logic signal input into the voltage level shift system 210 along input signal line 240 from the core logic component 220. FIG. 2e is a logic waveform diagram illustrating a logic signal output from the voltage level shift system 210 along output signal line 250 to the input/output interface 230. FIGS. 2c, 2d, and 2f are logic waveform diagrams illustrating a logic signal at various junctions within the voltage level shift system 210 based on the input and output signals illustrated in FIGS. 2b and 2e, respectively, and will be further described below.

It is noted that the logic signals and waveforms shown in FIGS. 2b, 2c, 2d, and 2f are illustrative of a voltage signal having a high voltage of, for example, 2.5 volts, represented by a logic "1" or a logic "high" and a low voltage of, for example, 0 volts, represented by a logic "0" or a logic "low." The waveform representing the output signal in FIG. 2e is illustrative of a voltage signal having a high voltage of, for example, 3.3 volts, represented by a logic "1" or a logic high, and a low voltage of, for example, 0 volts, represented by a logic "0" or a logic low. Further, it is noted that the transitions illustrated between logic lows and logic highs (and vice versa) in FIGS. 2b through 2f are exaggerated as slopes for illustration purposes only and that such transitions may be substantially vertical depending on a time differential between logic low and logic high transitions.

Figure 1:
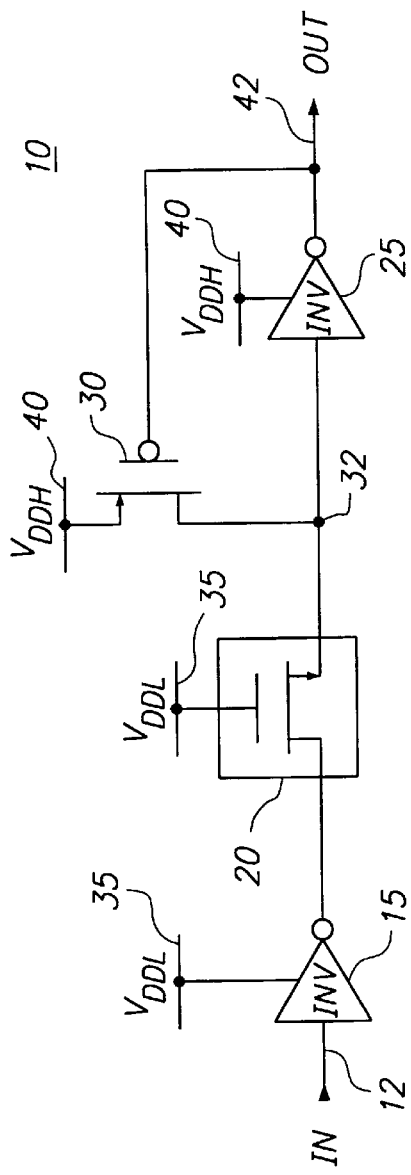
FIG. 1 illustrates a prior art conventional voltage level shift circuit.
Figure 3A:
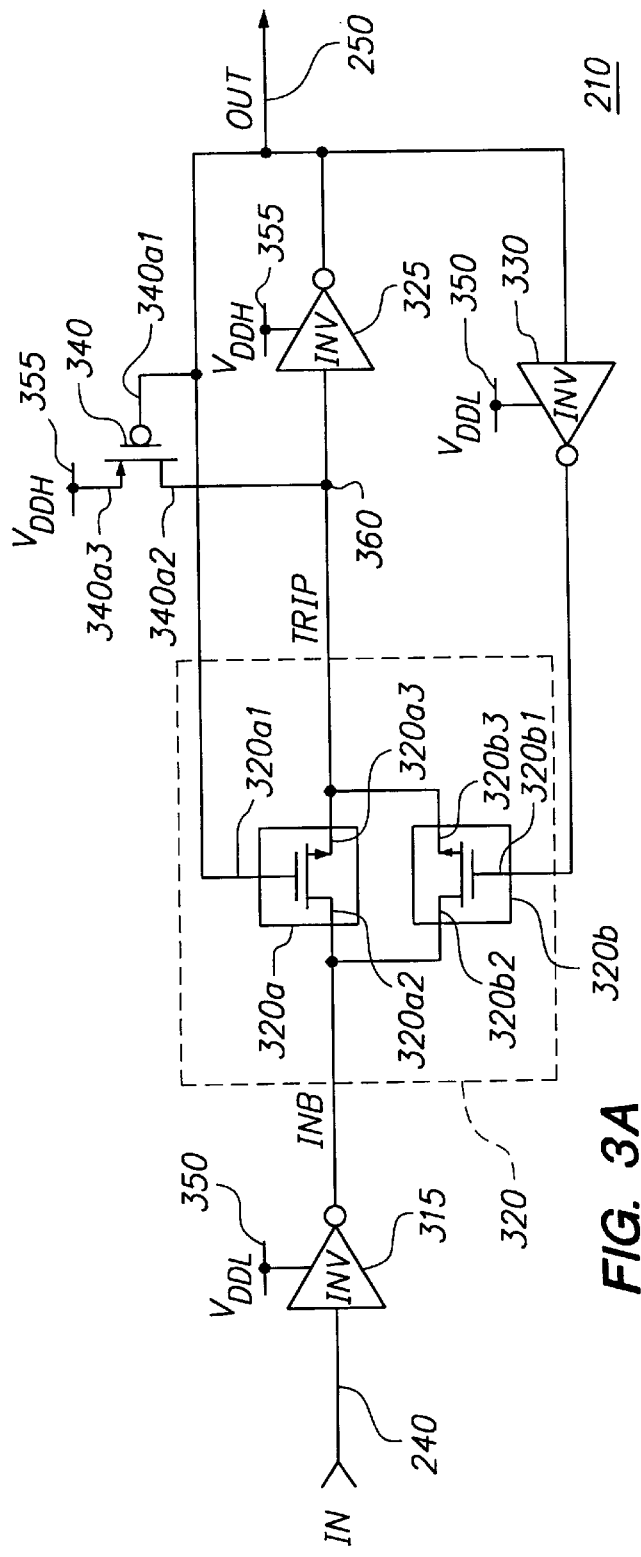
FIG. 3a illustrates a first embodiment of a voltage level shift system in accordance with the present invention.

FIG. 3a illustrates a first embodiment of a voltage level shift system 210 in accordance with the present invention. The voltage level shift system 210 includes a first inverter 315, a passgate subsystem 320, a second inverter 325, a third inverter 330, a weak pull-up device, e.g., a weak pull-up transistor 340, a low voltage supply rail 350, and a high voltage supply rail 355.

The passgate subsystem 320, or other functionally equivalent circuit or signal pass subsystem, allows for passing specific signals from one part of a circuit to another part of the circuit. In one embodiment, the passgate subsystem 320 includes a first passgate 320a and a second passgate 320b. The first passgate 320a includes a transistor, for example, a n-channel metal oxide semiconductor field effect transistor ("MOSFET") 320a having a gate 320a1, a drain 320a2, and a source 320a3. Similarly, the second passgate includes a transistor, for example, a n-channel MOSFET 320b having a gate 320b1, a drain 320b2, and a source 320a3. The pull-up transistor 340 includes, for example, an inverted gate 340a1, a drain 340a2, and a source 340a3.

Generally, the input signal line 240 is coupled to an input of the first inverter 315. The first inverter 315 is coupled to the passgate subsystem 320. The passgate subsystem 320 is coupled to the pull-up transistor 340, the second inverter 325, and the third inverter 330. An output of the second inverter 325 is coupled to the pull-up transistor 340, the third inverter 330, and the output signal line 250.

Specifically, an output of the first inverter 315 and an input of the second inverter 325 are coupled to each passgate 320a, 320b in the passgate subsystem 320. In particular, each drain 320a2, 320b2 of each of the first passgate 320a and the second passgate 320b is coupled to the output of the first inverter 315. Each source 320a3, 320b 3 of each of the first passgate 320a and the second passgate 320b is coupled to the input of the second inverter 325 and the drain 340a2 of the pull-up transistor 340. The gate 320a1 of the first passgate 320a is coupled to the inverted gate 340a1 of the pull-up transistor 340 and the output of the second inverter 325. The gate 320b2 of the second passgate 320b is coupled to an output of the third inverter 330.

The first inverter 315 and the third inverter 330 are coupled to the low voltage supply rail 350. The source 340a3 of the pull-up transistor 340 and the second inverter 325 are coupled to the high voltage supply rail 355. It is noted that in one embodiment the low voltage supply rail 350 is coupled to a voltage source, $V_{DDL}$, that is, for example, a 2.5 volt voltage source and the high voltage supply rail 355 is coupled to a voltage source, $V_{DDH}$, that is, for example, a 3.3 volt voltage source.

Operation of the first embodiment of the voltage level shift system 210 will be described through FIGS. 3b, 3c, and 4 by following the logic waveforms illustrated in FIGS. 2b through 2f. Generally, the voltage level shift system 210 uses the transitions, e.g., high to low or vice versa, of an input signal 280b input along the input signal line 240 to generate an output signal 280e for output along the output signal line 250. It is noted that the voltage level shift system 210 may be initialized for operation with the input signal 280b and the output signal 280e starting at a logic low with a transition to a logic high or vice versa.

Figure 3B:
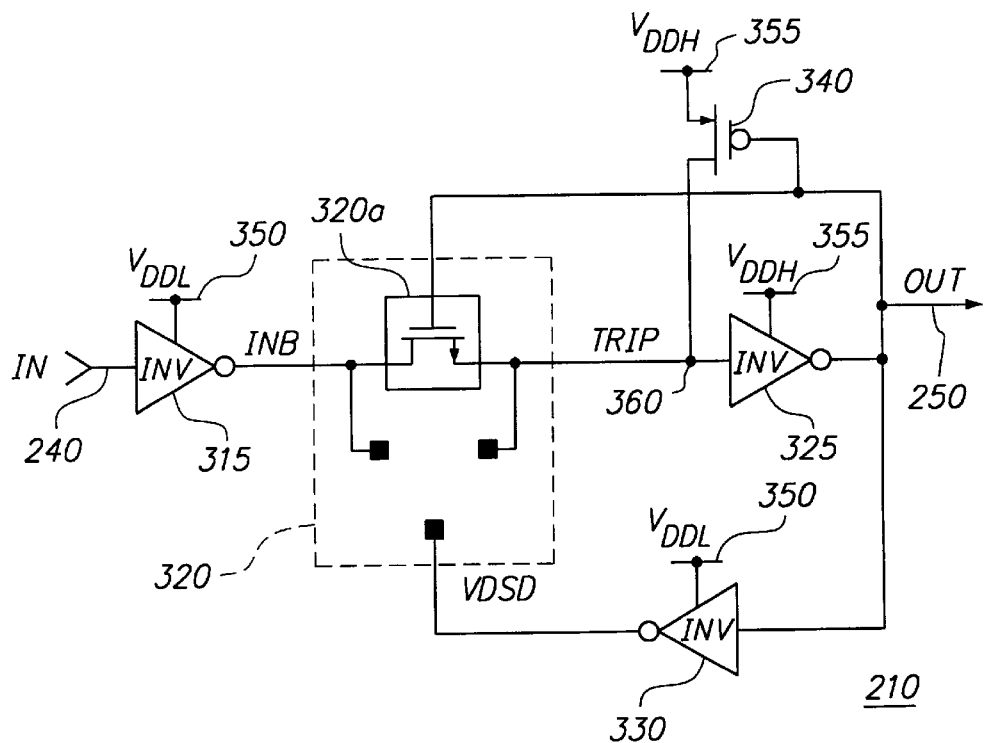
FIG. 3b illustrates conceptually the first embodiment of the voltage level shift system at a first transition in accordance with the present invention.
Figure 3C:
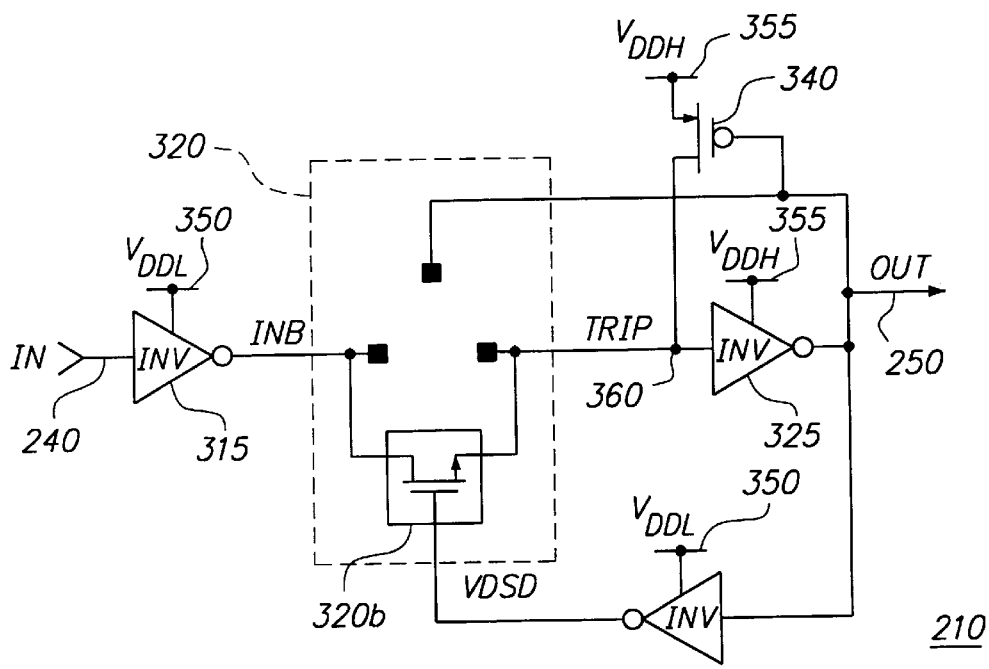
FIG. 3c illustrates conceptually the first embodiment of the voltage level shift system at a second transition in accordance with the present invention.
Figure 4:
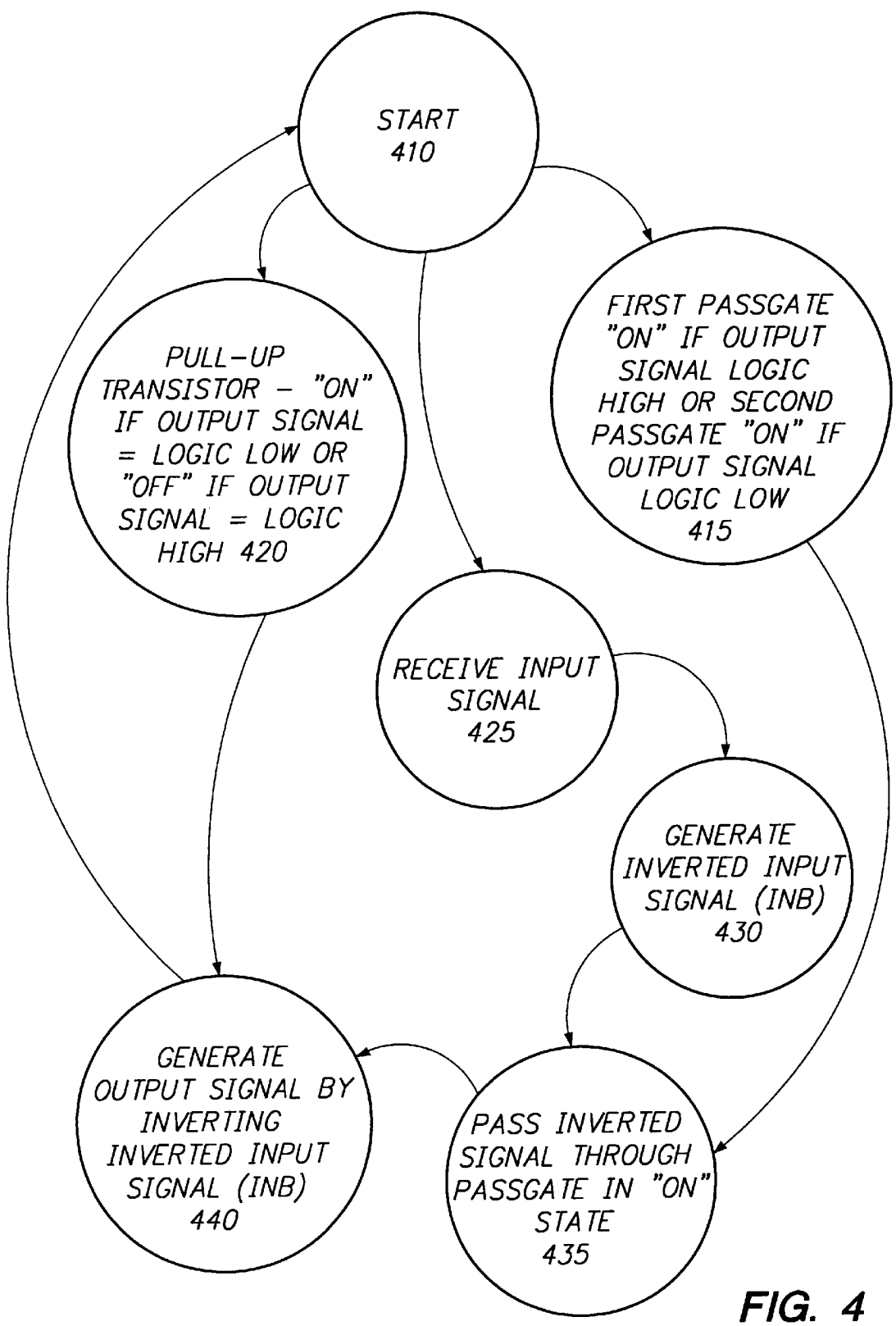
FIG. 4 is a process diagram illustrating operation of the first embodiment of the voltage level shift system in accordance with the present invention.

FIG. 3b is a conceptual illustration of the first embodiment of the voltage level shift system 210 illustrated in FIG. 3a where the input signal 280b and the output signal are at the logic high. FIG. 3b provides a conceptual illustration of the first embodiment of the voltage level shift system 210 illustrated in FIG. 3a once the output signal 280e transitions from a logic low signal to a logic high signal. FIG. 4 is a process diagram illustrating generally operation of the first embodiment of the voltage level shift system 210.

As an example, with the input signal 280b initially (start state 410), e.g., t=0, at a logic high and the output signal 280e initially at a logic high, the first passgate 320a of the passgate subsystem 320 is in an ON, or enabled, state 415 because its gate 320a1 is enabled by the logic high signal of the output signal 280e. The second passgate 320b of the passgate subsystem 320 creates an open circuit because its gate 320b1 receives a logic low signal 280f from the third inverter 330, which received the logic high output signal 280e. In addition, the pull-up transistor 340 is in an OFF, or disabled, state 420 because the inverted gate 340a1 receives the logic high output signal 280e.

When the input signal 280b transitions, e.g., t=1, from a logic high to a logic low along the input signal line 240, the output signal 280e along the output signal line 250 subsequently transitions from a logic high to a logic low. Specifically, the first inverter 315 receives 425 the logic low input signal 280b and generates 430 an inverted signal, INB 280c, that is a logic high signal. The inverted signal, INB 280c, passes 435 through the first passgate 320a of the passgate subsystem 320 because the gate 320a1 of the first passgate 320a continues to receive a logic high output signal 280e at this time. Similarly, the pull-up transistor 340 is in an OFF state 420 because its inverted gate 340a1 receives the logic high output signal 280e at this time. The inverted signal, INB 280c, is input into the second inverter 325. The second inverter 325 inverts the inverted signal, INB, 280c, to generate 440 a logic low output signal 280e that is output along the output signal line 250. Thus, the output signal 280e has transitioned from a logic high to a logic low after the input signal 280b transitioned from a logic high to a logic low.

The logic low output signal 280e from the second inverter 325 is also received by the third inverter 330, the inverted gate 340a1 of the pull-up transistor 340, and the gate 320a1 of the first passgate 320a of the passgate subsystem 320. FIG. 3c is a conceptual illustration of the first embodiment of the voltage level shift system 210 illustrated in FIG. 3a, once the output signal 280e transitions from the logic high signal to the logic low signal.

The logic low output signal 280e received at the gate 320a1 of the first passgate 320a of the passgate subsystem 320 switches the first passgate 320a from an ON state to an OFF state 415 and effectively creates an open circuit. The third inverter 350 receives and inverts the logic low output signal 280e to produce a logic high signal 280f. The logic high signal 280f is received by the gate 320b1 of the second passgate 320b of the passgate subsystem 320. The second passgate 320b switches from an OFF state to an ON state 415. Similarly, the inverted gate 340a1 of the pull-up transistor 340 receives the logic low output signal 280e to switch the pull-up transistor 340 from an OFF state to an ON state 420.

The pull-up transistor 340, which is in the ON state 420, pulls a trip node 360 to the high voltage supply rail voltage, $V_{DDH}$, and completely turns off a p-device within the second inverter 325 so that the second inverter 325 does not draw DC current. By not drawing DC current, the system saves power because the signal received by the second inverter 325 is at a voltage of $V_{DDH}$ rather than $(V_{DDH})-(V_T)$, where $V_T$ is 0.7 volts.

With the voltage level shift system 210 at the conceptual stage illustrated in FIG. 3c, when the input signal 280b transitions from the logic low to the logic high, e.g., t=2, the voltage level shift system 210 subsequently transitions the output signal 280e from the logic low to the logic high. Specifically, logic high input signal 280b is received 425 and inverted by the first inverter 315. The first inverter 315 generates 430 an inverted signal, INB 280c, that is a logic low signal. The inverted signal, INB 280c, is passed 435 by the second passgate 320b of the passgate subsystem 320 and input into the second inverter 325.

The logic high output signal 280e is received by the inverted gate 340a1 of the pull-up transistor 340, the gate 320a1 of the first passgate 320a, and the third inverter 330. The first passgate 320a switches from an OFF state back to an ON state 415. The inverted gate 340a1 switches the pull-up transistor 340 from an ON state back to an OFF state 420. The third inverter 330 inverts the logic high output signal 280e and produces a logic low signal 280f that switches the second passgate 320b of the passgate subsystem 320 from an ON state back to an OFF state 415.

Thus, the voltage level shift system 210 is now conceptually configured as illustrated in FIG. 3b. When the input signal 280b transitions from a logic high to a logic low, e.g., t=3, the voltage level shift system 210 operates as described above with respect to FIG. 3b. The voltage level shift system 210 continues to conceptually configure itself as the system illustrated in FIGS. 3b and 3c so long as the input signal 280b, and subsequently, the output signal 280e, continue to transition between a logic high and a logic low and vice versa.

The voltage level shift system 210 of the present invention beneficially includes a passgate subsystem to facilitate signal transitions between a logic high and a logic low between two components, for example, the core logic component 220 and the input/output interface 230. By eliminating delays for inverters to invert a signal from, for example, a logic low to a logic high, the present invention advantageously provides for faster switching times between the two signal levels. Faster switching times between logic lows and logic highs increases overall microchip speed. Further, because a voltage level build-up necessary for switching is eliminated, the microchip consumes less power, and therefore, is beneficial for low power system and circuit applications. Moreover, the present invention also beneficially provides balanced rise and fall delay times, i.e., the rise and fall delays are equal, therefore also increasing system efficiency.

Figure 5:
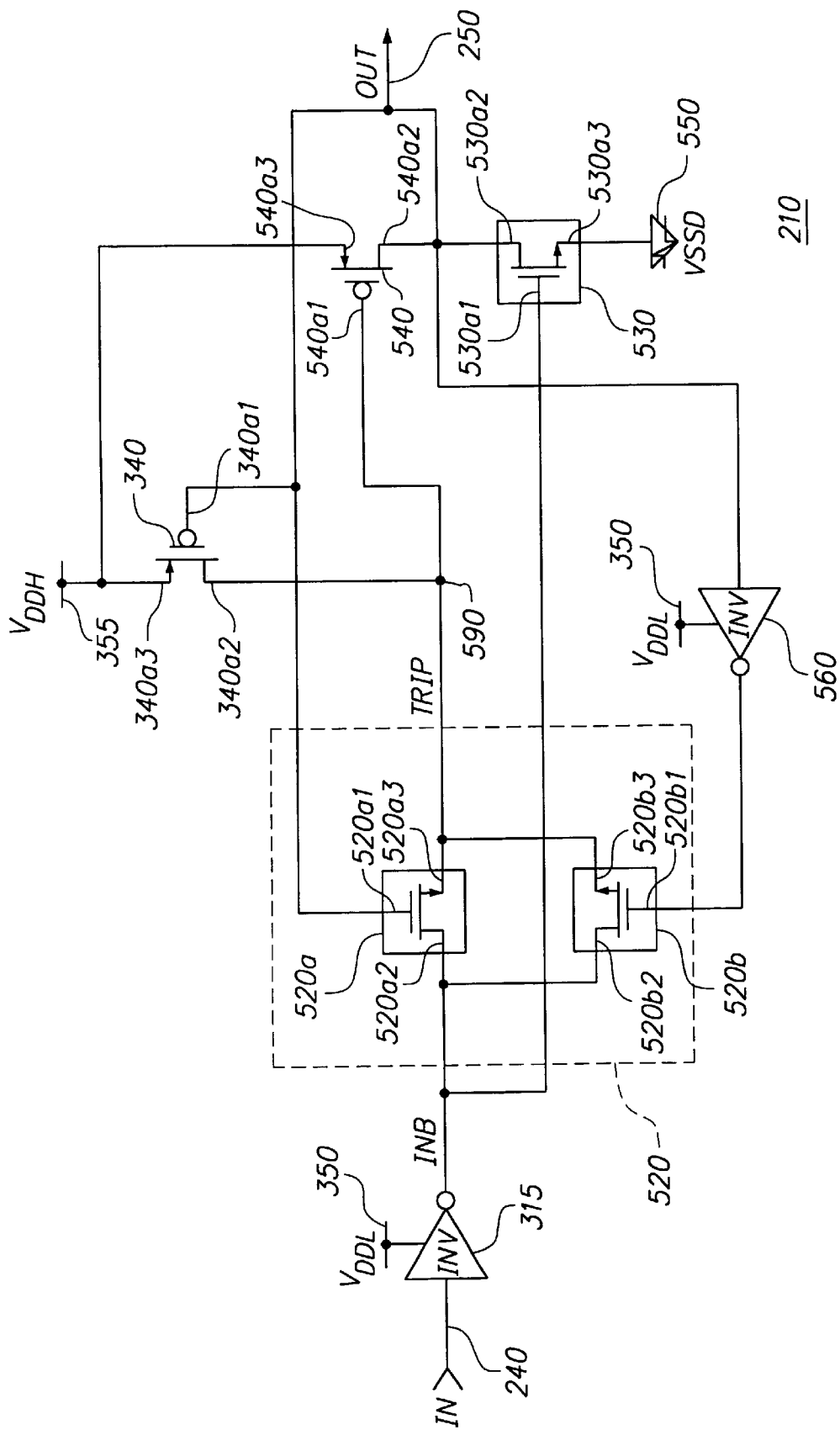
FIG. 5 illustrates a second embodiment of a voltage level shift system in accordance with the present invention.

FIG. 5 illustrates a second embodiment of the voltage level shift system 210 in accordance with the present invention. The second embodiment of the voltage level shift system 210 includes the first inverter 315, the pull-up transistor 340, the voltage low supply rail 350, and the voltage high supply rail 355.

The second embodiment of the voltage level shift system 210 also includes a signal pass subsystem 520, a pull-down device, e.g., a n-channel pull-down transistor 530 having a gate 530a1, a drain 530a2, and a source 530a3, a pull-up device, e.g., a p-channel pull-up transistor 540 having an inverted gate 540a1, a drain 540a2, and a source 540a3, a second inverter 560, and a source voltage $V_{SSD}$ 550 (e.g., 0 volts). It is noted that the signal pass subsystem 520 is functionally equivalent to the passgate subsystem 320 described above.

The signal pass subsystem 520 includes a first passgate 520a having a gate 520a1, a drain 520a2, and a source 520a3 and a second passgate 520b having a gate 530a1, a drain 530a2, and a source 530a3. Both the first passgate 520a and the second passgate 520b may be, for example, an n-channel MOSFET transistor.

Generally, in the second embodiment of the voltage level shift system 210, the input signal line 240 is coupled to the input of the first inverter 315. The output of the first inverter 315 is coupled to the passgate subsystem 520 and the n-channel pull-down transistor 530. The n-channel pull-down transistor 530 is coupled to the voltage source $V_{SSD}$ 550. The signal pass subsystem 520 is coupled to the pull-up transistor 340, the p-channel pull-up transistor 540, and the second inverter 560. The pull-up transistor 340 is coupled to the p-channel pull-up transistor 540.

The signal pass subsystem 520, the pull-up transistor 340, the p-channel pull-up transistor 540, the second inverter 560, and the n-channel pull-down transistor 530 are coupled to the output signal line 250. The first inverter 315 is coupled to the voltage low supply rail 350 and the pull-up transistor is coupled to the voltage high supply rail 355.

Specifically, the first inverter 315 is coupled to each drain 520a2, 520b2 of each passgate 520a, 520b and each gate 530a1, 530b2 of each n-channel pull-down transistor 530. The source 530a3 of the n-channel pull-down transistor 530 is coupled to the voltage source $V_{SSD}$ 550. The drain 530a2 of the p-channel pull-down transistor 530 is coupled to the drain 540a2 of the n-channel pull-up transistor 540 and an input of the second inverter 560. The source 540a3 of the pull-up transistor 540 is coupled to the voltage high supply rail 355. The second inverter 560 is coupled to the voltage low supply rail 350.

The source 520a3, 520b3 of the each passgate 520a, 520b is coupled together and to the drain 340a2 of the pull-up transistor 340 and to the inverted gate 540a1 of the p-channel pull-up transistor 540. The drain 520b1 of the second passgate 520b is coupled to an output of the second inverter 560. The source 340a3 of the pull-up transistor is coupled to the voltage high supply rail 355. The output signal line 250 is coupled to the gate 520a1 of the first passgate 520, the inverted gate 340a1 of the pull-up transistor, the drain 530a2 of the n-channel pull-down transistor 530, and the drain 540a2 of the p-channel pull-up transistor 540.

Generally, one skilled in the art will appreciate that the principles regarding the operation of the second embodiment of the voltage level shift system 210 are functionally similar to those for the first embodiment of the voltage level shift system 210. Operation of the second embodiment of the voltage level shift system 210 can be described using the signal waveforms described in FIGS. 2b through 2e.

For example, if the input signal 280b and the output signal 280e are to transition from an initial logic high to a logic low, initially, the first passgate 520a is in an ON state, the second passgate 520b is in an OFF state, and the pull-up transistor 340 is in an OFF state. When a logic low input signal 280b is received by the first inverter 315 from along the input signal line 240, the first inverter 315 inverts it to produce an inverted signal, INB 280c, that is a logic high signal. The inverted, INB 280c, logic high signal is transmitted to the p-channel pull-up transistor 540. The inverted gate 540a1 of the p-channel pull-up transistor 540 receives the inverted, INB 280c, logic high signal and places the p-channel transistor 540 in an OFF state.

Simultaneously, the inverted, INB 280c, logic high signal is transmitted from the first inverter 315 to the n-channel pull-down transistor 530. The gate 530a1 of the n-channel pull-down transistor 530 receives the inverted, INB 280c, logic high signal and places the n-channel pull-down transistor 530 in an ON state. The n-channel pull-down transistor 530 transitions the output signal 280e by pulling it down from a logic high to a logic low.

With the output signal 280e at a logic low, the inverted gate 340a1 of the pull-up transistor 340 places the pull-up transistor 340 into an ON state. With the pull-up transistor 340 in the ON state, a trip node 590 gets pulled to the supply high voltage rail 355 voltage, $V_{DDH}$, and completely shuts off the p-channel transistor 540. The logic low output signal passes through the inverter 560, so that the second passgate 520b is in the ON state.

When the input signal 280b transitions from a logic low to a logic high the first inverter 315 inverts the logic high input signal 280b to produce an inverted, INB 280c, logic low signal. The first passgate 520a is in an OFF state and the second passgate 520b is in an ON state due to the output signal 280e being at a logic low. The inverted, INB 280c, logic low signal is received by the gate 530a1 of the n-channel pull-down transistor 530a and is passed through the second passgate 520b to the p-channel pull-up transistor 540. The logic low signal places the n-channel pull-down transistor 530a in an OFF state and the p-channel pull-up transistor 540 in an ON state.

As with the first embodiment of the voltage level shift system 210 described above, the second embodiment of the voltage level shift system 210 also is able to transition an output signal 280e from a logic high to a logic low and vice versa once an input signal 280b transitions from a logic high to a logic low and vice versa. Further, the second embodiment of the voltage level shift system 210 provides numerous advantages, including faster microchip switching times, reduced power consumption, and balanced output signal rise and fall delay times.

FIG. 6 illustrates a third embodiment of a voltage level shift system 210 in accordance with the present invention. The third embodiment of the voltage level shift system 210 includes the first inverter 315, the pull-up transistor 340 having the inverted gate 340a, the drain 340b, and the source 340c, the voltage low supply rail 350 and the voltage high supply rail 355. The third embodiment of the voltage level shift system 210 also includes a passgate subsystem 620, a second inverter 630, and a third inverter 640.

The passgate subsystem 620 is functionally equivalent to the passgate subsystem 320 described above. The passgate subsystem 620 includes a first passgate 620a and a second passgate 620b. The first passgate 620a is a n-channel passgate having a gate, a drain, and a source. The second passgate 620b is a p-channel passgate having an inverted gate, a drain, and a source.

Generally, the input of the first inverter 315 is coupled to the input signal line 240 and the output of the first inverter 315 is coupled to the passgate subsystem 620. The passgate subsystem 620 is coupled to the pull-up transistor 340, an input of the second inverter 630, and an output of the third inverter 640. An output of the second inverter 630 is coupled to an input of the third inverter 640, the pull-up transistor 340, and the output signal line 250. The first inverter 315 and the passgate subsystem 620 are coupled to the voltage low supply rail 350. The pull-up transistor 340, the second inverter 630, and the third inverter 640 are coupled to the voltage high supply rail 355.

Specifically, in the passgate subsystem 620, the n-channel passgate 620a is coupled to the p-channel passgate 620b. In particular, the drain and the source of the n-channel passgate 620a are respectively coupled to the drain and the source of the p-channel passgate 620b. The drain of each passgate 620a, 620b is coupled to an output of the first inverter 315. The source of each passgate 620a, 620b is coupled to the pull-up transistor 340 and an input of the second inverter 630. The gate of the n-channel passgate 620a is coupled to the voltage low supply rail 350. The inverted gate of the p-channel passgate 620b is coupled to the output of the third inverter 640.

The source of the pull-up transistor 340 is coupled to the voltage high supply rail 350 and the drain of the pull-up transistor 340 is coupled to the source of each passgate 620a, 620b and to the input of the second inverter 630. The inverted gate of the pull-up transistor 340 is coupled to an output of the second inverter 630, an input of the third inverter 640, and the output signal line 250.

Generally, one skilled in the art will appreciate that the principles regarding the operation of the third embodiment of the voltage level shift system 210 are functionally similar to those for the first embodiment of the voltage level shift system 210. Operation of the third embodiment of the voltage level shift system 210 can be described using the signal waveforms described in FIGS. 2b through 2e.

For example, if the input signal 280b and the output signal 280e transition from an initial logic high to a logic low, e.g., t=0, the pull-up transistor 340 is initially in an OFF state and the third inverter 640 produces a logic low signal. When the logic low input signal 280b is received by the first inverter 315 from along the input signal line 240, the first inverter 315 inverts it to produce an inverted signal, INB 280c, that is a logic high signal. The p-channel passgate 620b of the passgate subsystem 620 is in an ON state and the inverted signal, INB 280c, is received by the second inverter 630.

The second inverter 630 inverts the inverted signal, INB 280c, to produce an output signal 280e along the output signal line 250 that transitions from a logic high to a logic low. The logic low output signal 280e places the pull-up transistor 340 in an ON state. The pull-up transistor 340 pulls a trip node 690 to the voltage high supply rail 355 voltage, $V_{DDH}$, and completely turns off the p-device within the second inverter 630 so that the second inverter 630 does not draw DC current. By not drawing DC current, the system saves power because the signal received by the second inverter 325 is at a voltage of $V_{DDH}$ rather than $(V_{DDH}) - (V_T)$.

The logic low output signal 280e is also received by the third inverter 640 which produces a logic high signal that places the p-channel passgate 620b in an OFF state. When the input signal 280b transitions from a logic low to a logic high, the first inverter 315 inverts the signal 280b to produce an inverted signal, INB 280c, that is a logic low signal. The inverted signal, INB 280c, passes through the n-channel passgate 620a to the second inverter 630 to produce a logic high output signal 280e along the output signal 250.

The logic high output signal 280e is also input by the third inverter 640, which produces a logic low signal that switches the p-channel passgate 620b from the OFF state to an ON state. The logic high output signal 280e also switches the pull-up transistor 340 from the ON state to an OFF state. The third embodiment of the voltage level shift system 210 is now ready for the input signal 280b to transition from the logic high to a logic low so that the output signal 280e transitions from the logic high to a logic low as described above.

Thus, the third embodiment of the voltage level shift system 210, similar to the first embodiment and the second embodiment, is able to transition the input 280b and the output signal 280e from a logic high to a logic low and vice versa as described above. The third embodiment of the voltage level shift system 210 provides advantages that include faster microchip switching time, reduced power consumption, and balanced output signal rise and fall delay times.

FIG. 7 illustrates a fourth embodiment of a voltage level shift system 210 in accordance with the present invention. The fourth embodiment of the voltage level shift system 210 includes the first inverter 315, the pull-up transistor 340 having the inverted gate, the drain, and the source, the voltage low supply rail 350, and the voltage high supply rail 355. The fourth embodiment of the voltage level shift system 210 also includes a passgate subsystem 720, a pull-up device, e.g., a p-channel pull-up transistor 730a having an inverted gate, a drain, and a source, a pull-down device, e.g., a n-channel pull-down transistor 730b having a gate, a drain, and a source, and a second inverter 740.

The passgate subsystem 720 is functionally equivalent to the passgate subsystem 320 described above. The passgate subsystem 720 includes a n-channel passgate 720a having a gate, a drain, and a source, and a p-channel passgate 720 having an inverted gate, a drain, and a source.

Generally, the input signal line 240 is coupled to the input of the first inverter 315. The output of the first inverter 315 is coupled to the passgate subsystem 720 and the gate of the n-channel pull-down transistor 730b. The passgate subsystem 720 is coupled to the pull-up transistor 340 and the p-channel pull-up transistor 730a. The p-channel pull-up transistor 730a and the n-channel pull down transistor 730b are coupled to the output signal line 250, the second inverter 740, and the pull-up transistor 340. The first inverter 315 and the passgate subsystem 720 are coupled to the voltage low supply rail 350. The pull-up transistor 340, the p-channel pull-up transistor 730a, and the second inverter 740 are coupled to the voltage high supply rail 355.

Specifically, in the passgate subsystem 720, the drain and the source of the n-channel passgate 720a is respectively coupled to the drain and the source of the p-channel passgate 720b. The drains of the passgates 720a, 720b are coupled to the output of the first inverter 315. The sources of the passgates 720b are coupled to the drain of the pull-up transistor 340 and the inverted gate of the p-channel pull-up transistor 730a. The gate of the n-channel passgate 720a is coupled to the voltage low supply line 350. The inverted gate of the p-channel passgate 720b is coupled to the output of the second inverter 740.

The source of the p-channel pull-up transistor 730a is coupled to the voltage high supply rail 355. The source of the n-channel pull-down transistor 730b is coupled to a ground. The drain of the p-channel pull-up transistor 730a and the drain of the p-channel pull-down transistor 730b are coupled to each other, the output signal line 250, the inverted gate of the pull-up transistor 340, and the input of the second inverter 740.

Generally, one skilled in the art will appreciate that the principles regarding the operation of the fourth embodiment of the voltage level shift system 210 are functionally similar to those for the first embodiment of the voltage level shift system 210. Operation of the fourth embodiment of the voltage level shift system 210 can be described using the signal waveforms described in FIGS. 2b through 2e.

For example, if the input signal 280b and the output signal 280e are to transition from an initial logic high to a logic low, e.g., t=0, the pull-up transistor 340 is initially in an OFF state and the second inverter 740 produces a logic low signal. When the logic low input signal 280b is received by the first inverter 315 from along the input signal line 240, the first inverter 315 inverts it to produce an inverted signal, INB 280c, that is a logic high signal. The p-channel passgate 720b of the passgate subsystem 720 is in an ON state and the inverted signal, INB 280c, is received at the inverted gate of the p-channel pull-up transistor 730a. The logic high inverted signal, INB 280c, is also received by the gate of the n-channel pull-down transistor 730b to place that transistor 730b in an ON state.

With the p-channel pull-up transistor 730a in an OFF state and the n-channel pull-down transistor 730b in an ON state, the logic high output signal 280e transitions to a logic low output signal 280e along the output signal line 250. In turn, the logic low output signal 280e places the pull-up transistor 340 in an ON state so that a trip node 790 is pulled to the supply high voltage rail 355 voltage, $V_{DDH}$. This completely shuts off the p-channel transistor 730a. The logic low output signal 280e is also received by the second inverter 740 which produces a logic high signal that places the p-channel passgate 720b in an OFF state.

When the input signal 280b transitions from a logic low to a logic high, e.g., t=1, the first inverter 315 inverts the input signal 280b to produce an inverted signal, INB 280c, that is a logic low signal. The inverted signal, INB 280c, passes through the n-channel passgate 720a of the passgate subsystem 720 to the inverted gate of the p-channel pull-up transistor 730a to switch that transistor 730a to an ON state.

The logic low inverted signal, INB 280c, is also received by the gate of the n-channel pull-down transistor 730b, placing that transistor 730b in an OFF state. With the p-channel pull-up transistor 730a in an ON state and the n-channel pull-down transistor 730b in an OFF state, the output signal 280e transitions from a logic low to a logic high.

The logic high output signal 280e is also input by the second inverter 740, which produces a logic low signal that switches the p-channel passgate 720b from the OFF state to an ON state. The logic high output signal 280e also switches the pull-up transistor 340 from the ON state to an OFF state. The fourth embodiment of the voltage level shift system 210 is now ready for the input signal 280b to transition from the logic high to a logic low, e.g., t=2, so that the output signal 280e subsequently transitions from the logic high to a logic low as described above.

Thus, the fourth embodiment of the voltage level shift system 210, similar to the first, second, and third embodiments, is able to transition the input and the output signal from a logic high to a logic low and vice versa as described above. The fourth embodiment of the voltage level shift system 210 provides also provides advantages that include, for example, faster microchip switching time, reduced power consumption, and balanced output signal rise and fall delay times.

Figure 8:
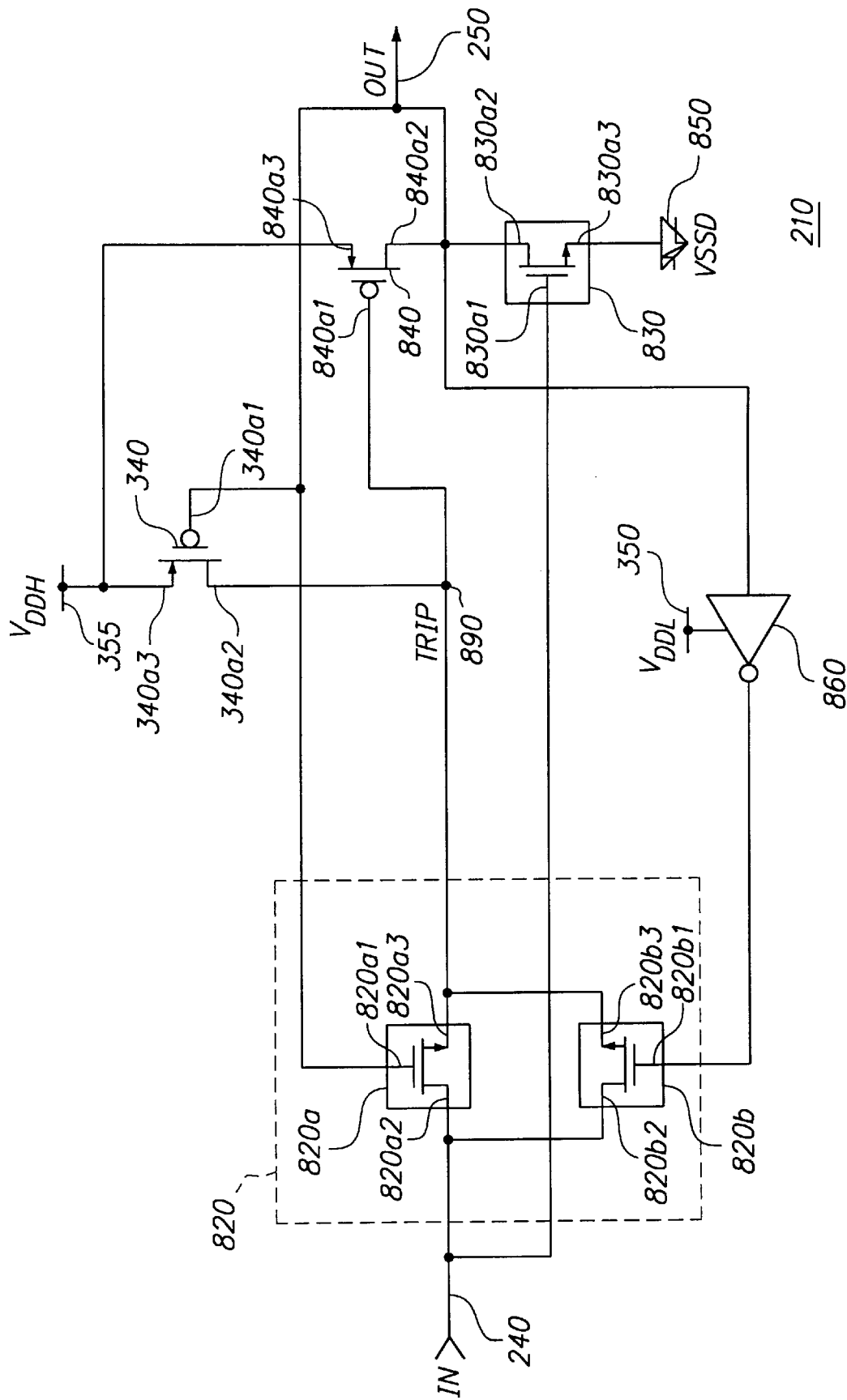
FIG. 8 illustrates a fifth embodiment of a voltage level shift system in accordance with the present invention.

FIG. 8 illustrates a fifth embodiment of the voltage level shift system 210 in accordance with the present invention. The fifth embodiment of the voltage level shift system 210 includes the input signal line 240, the output signal line 250, the voltage low supply rail 340, the voltage high supply rail 355, and the pull-up transistor 350. The fifth embodiment of the voltage level shift system 210 also includes a signal pass subsystem 820, a pull-up device, e.g., p-channel pull-up transistor 840, a pull-down device, e.g., a n-channel pull-down transistor 830, a source voltage $V_{SSD}$ 850, and an inverter 860.

The signal pass subsystem 820 is functionally similar to the passgate subsystem 320 described above. The signal pass subsystem 820 includes a first passgate 820a and a second passgate 820b. In one embodiment, each passgate 820a, 820b includes an n-channel MOSFET transistor having a gate 820a1, 820b2, a drain 820a2, 820b2, and a source 820a3, 820b3.

The p-channel pull-up transistor 840 is functionally similar to the p-channel pull-up transistor 540 described above. The p-channel pull-up transistor 840 includes an inverted gate 840a1, a drain 840a2, and a source 840a3. Similarly, the n-channel pull-down transistor 830 is functionally equivalent to the n-channel pull-down transistor 530 described above. Further, in one embodiment the voltage source $V_{SSD}$ is 0 volts.

Generally, the input signal line 240 is coupled to the signal pass subsystem 820 and the n-channel pull-down transistor 830. The signal pass subsystem 820 is coupled to the pull-up transistor 340, the p-channel pull-up transistor 840, and the inverter 860. The inverter 860 is coupled to the n-channel pull-down transistor 830 and the p-channel pull-up transistor 840. The signal pass subsystem 820, the pull-up transistor 340, the n-channel pull-down transistor 830, the p-channel pull-down transistor 840, and the inverter 860 are coupled to the output signal line 250. The p-channel pull-down transistor is coupled to the voltage source $V_{SSD}$ 850. The pull-up transistor 340 is coupled to the voltage high supply rail 355. The inverter 860 is coupled to the voltage low supply rail 350.

Specifically, the input signal line 240 is coupled to each drain 820a2, 820b2 of each passgate 820a, 820b and each gate 830a1, 830b2 of each n-channel pull-down transistor 830. The drain 830a2 of the p-channel pull-down transistor 830 is coupled to the drain 840a2 of the n-channel pull-up transistor 840 and an input of the second inverter 860. The source 820a3, 820b of the each passgate 820a, 820b is coupled together and to the drain 340a2 of the pull-up transistor 340 and to the inverted gate 840a1 of the p-channel pull-up transistor 840. The gate 820b1 of the second passgate 820b is coupled to an output of the inverter 860.

The source 340a3 of the pull-up transistor is coupled to the voltage high supply rail 355. The output signal line 250 is coupled to the gate 820a1 of the first passgate 820, the inverted gate 340a1 of the pull-up transistor 340, the drain 830a2 of the n-channel pull-down transistor 830, and the drain 840a2 of the p-channel pull-up transistor 840. The drains 830a2, 840a2 of the n-channel pull-down transistor 830 and the p-channel pull-up transistor 840 are coupled together. The source 830a3 of the n-channel pull-down transistor 830 is coupled to the voltage source $V_{SSD}$ 850

Generally, one skilled in the art will appreciate that the principles regarding the operation of the second embodiment of the voltage level shift system 210 are functionally similar to those for the first embodiment of the voltage level shift system 210, except that the output signal transition is opposite to the input signal transition. Operation of the second embodiment of the voltage level shift system 210 can be described using the signal waveform described in FIGS. 2b.

For example, if the input signal 280b transitions from an initial logic low to a logic high, the output signal transitions from an initial logic high to a logic low. Thus, initially, the first passgate 820a is in an ON state, the second passgate 820b is in an OFF state, and the pull-up transistor 340 is in an OFF state.

The logic high input signal 280b is received by and passed through the first passgate 820a. The passed logic high input signal 280b is received by the inverted gate 840a1 p-channel pull-up transistor 840 so that the p-channel pull-up transistor 840 turns to an OFF state. The logic high input signal 280b is also received by the gate 830a1 of the n-channel pull-down transistor 830 to place that transistor 830 in an ON state. With the p-channel pull-up transistor 840 in the OFF state and the n-channel pull-down transistor 830 in the ON state, the output signal transitions from logic high to a logic low along the output signal line 250.

Once the output signal transitions from the logic high to the logic low, the pull-up transistor 340 turns to an ON state so that a trip node 890 is pulled to the supply high voltage rail 355 voltage, $V_{DDH}$. This completely shuts off the p-channel transistor 840. In addition, the first passgate 820a turns to an OFF state and the second passgate 820b turns to an ON state. The second passage 820b turns to an ON state because the logic low output signal is inverted by the inverter 860 to produce a logic high signal that is sent to the gate 820b1 of the second passgate 820b.

When the input signal 280b transitions from a logic high to a logic low, the logic low input signal passes through the second passgate 820b of the passgate subsystem 820b to the inverted gate 840a1 of the p-channel pull-up transistor 840. The passed logic low input signal places the p-channel pull-up transistor in an ON state. The logic low input signal is also received at the gate 830a1 of the n-channel pull-down transistor 830 so that the n-channel pull-down transistor is placed in an OFF state.

With the p-channel pull-up transistor 840 in the ON state, the n-channel pull-down transistor 830 in the OFF state, and the pull-up transistor 340 in the ON state, the output signal transitions from the logic low to a logic high along the output signal line 250. The voltage level shift system 210 is now ready to transition the output signal from the logic high to the logic low when the input signal transitions from the logic low to the logic high, as described above. It is noted that the logic low output signal may be at a voltage level of, for example, 0 volts, and the logic high output signal may be at a voltage level of, for example, 3.3 volts.

The fifth embodiment of the voltage level shift system 210 is able to quickly and efficiently transition an output signal from a logic high to a logic low and vice versa once an input signal 280b transitions from a logic low to a logic high and vice versa. The fifth embodiment of the voltage level shift system 210 provides numerous advantages, including faster microchip switching times, reduced power consumption, and balanced output signal rise and fall delay times.

While particular embodiments and applications of the present invention have been illustrated and described, it is to be understood that the invention is not limited to the precise construction and components disclosed herein and that various modifications, changes and variations which will be apparent to those skilled in the art may be made in the arrangement, operation and details of the method and apparatus of the present invention disclosed herein without departing from the spirit and scope of the invention as defamed in the appended claims.

What is claimed is:

1. A voltage level shift system for transitioning an output signal between a first level and a second level, the system comprising:

a first inverter, coupled to receive an input signal transitioning between a first level and a second level, the first inverter for producing an inverted signal of the input signal transitioning between the first level and the second level;

a signal pass subsystem having a first path and a second path, each path coupled to the first inverter and each path for passing the inverted signal, the first path enabled in response to the output signal at the first level;

a second inverter coupled to receive the inverted signal for producing the output signal at the second level and disabling the first path; and a third inverter coupled to the second inverter and the signal pass subsystem; the third inverter producing an inverted signal of the output signal at the second level for enabling the second path.

2. The voltage level shift system in claim 1, wherein the first and the third inverters are coupled to a low voltage supply and the second inverter is coupled to a high voltage supply.

3. The voltage level shift system in claim 2, wherein the first path comprises a n-channel MOSFET.

4. The voltage level shift system in claim 1, wherein the second path comprises a n-channel MOSFET.

5. The voltage level shift system in claim 1, wherein the first inverter is coupled to a low voltage supply and the second and third inverters are coupled to a high voltage supply.

6. The voltage level shift system in claim 5, wherein the first path comprises a n-channel MOSFET.

7. The voltage level shift system in claim 5, wherein the second path comprises a p-channel MOSFET.

8. The voltage level shift system in claim 5, wherein the second inverter comprises a p-channel MOSFET and a n-channel MOSFET, the p-channel MOSFET coupled to the signal pass subsystem and the high voltage supply and the n-channel MOSFET coupled to the p-channel MOSFET, a ground, and the first inverter.

9. The voltage level shift system in claim 3, further comprising a pull-up device, the pull-up device coupled to the signal pass subsystem and the second inverter, for turning off a p-device within the second inverter.

10. A voltage level shift system for transitioning an output signal between a first level and a second level, the system comprising:

an inverter, coupled to receive an input signal transitioning between the first level and the second level the inverter, for producing an inverted signal of the input signal transitioning between the first level and the second level;

a first passgate for coupling to the inverter in response to the output signal being at a first level;

a second passgate for coupling to the inverter in response to the output signal being at a second level;

a first inverting device, coupled to receive the inverted input signal in response to the first passgate being coupled to the inverter, for producing the output signal transitioning between the first level and the second level; and a second inverting device, coupled to receive the output signal and coupled to the second passgate, for coupling the second passgate to pass the inverted input signal in response to the output signal being at the second level.

11. The voltage level shift subsystem in claim 10, wherein the input signal and the output signal transition from the first level to the second level.

12. The voltage level shift subsystem in claim 10, wherein the input signal and the output signal transition from the second level to the first level.

13. The voltage level shift system in claim 12, further comprising a pull-up device, the pull-up device coupled to the first passgate, the second passgate, and the first inverting device, for turning off a p-device within the first inverting device.

14. A voltage level shift system for transitioning an output signal between a first level and a second level, the system comprising;

an inverter, coupled to receive an input signal transitioning between the first level and the second level, for producing an inverted signal of the input signal transitioning between the first level and the second level;

a first passgate, coupled to the inverter, for passing the inverted signal in response to the output signal being at the first level;

a second passgate, coupled to the inverter, for passing the inverted signal in response to the output signal being at the second level;

a pull-up device, coupled to the first passgate and to the second passgate, for transitioning the output signal between the first level and the second level in response to the inverted signal being at a second level; and a pull-down device, coupled to the first passgate and the second passgate, for transitioning the output signal between the first level and the second level in response to the inverted signal being at a first level.

15. The voltage level shift system in claim 14, wherein the input signal and the output signal transition from the first level to the second level.

16. The voltage level shift system in claim 14, wherein the input signal and the output signal transition from the second level to the first level.

17. The voltage level shift system in claim 14, wherein the pull-up device comprises a p-channel MOSFET.

18. The voltage level shift system in claim 14, wherein the pull-down device comprises a n-channel MOSFET.

19. The voltage level shift system in claim 17, further comprising a pull-up transistor, the pull-up transistor coupled to the first passgate, the second passgate, the pull-up device, and the pull-down device.

20. A method for transitioning a voltage signal from a first component providing a voltage signal at a first voltage to a seconds component receiving a voltage signal at a second voltage, the method comprising:

receiving an input signal transitioning between a first level and a second level to transition an output signal between a first level and a second level;

inverting the input signal to generate a first inverted signal in response to the input signal at the first level or a first inverted signal in response to the input signal at the second level;

passing the first inverted signal through a first path of a signal pass system in response to the output signal at the first level or a second path in response to the output signal at the second level; and inverting the passed first inverted signal to generate the output signal at the first level in response to the first inverted signal at the second level or to generate the output signal at the second level in response to the first inverted signal at the first level.

21. The method in claim 20, further comprising enabling a pull-up device in response to the output signal at the second level.

22. A voltage level shift system for transitioning an output signal between a first level and a second level, the system comprising:

a signal pass subsystem, coupled to receive an input signal, the signal pass subsystem including a first path and a second path, the first path enabled in response to the output signal at a first level and the second path enabled in response to the output signal at a second level;

a pull-up device, coupled to the signal pass subsystem, for transitioning the output signal between a first level and a second level in response to receiving an input signal at a first level;

a pull-down device, coupled to the signal pass subsystem, for transitioning the output signal between a first level and a second level in response to receiving an input signal at a second level; and an inverter, coupled to receive the output signal and coupled to the signal pass subsystem, for producing an inverted signal at a first level in response to the output signal being at a second level and for producing an inverted signal at a second level in response to the output signal being at the first level, the second path enabled by the inverted signal at the second level and disabled by the inverted signal at the first level.

23. The voltage level shift system in claim 22, wherein the output signal transitions from the first level to the second level in response to the input signal transitioning from the second level to the first level.

24. The voltage level shift system in claim 23, wherein the first path of the signal pass subsystem includes a first passgate and the second path of the signal pass subsystem includes a second passgate.

25. The voltage level shift system in claim 23, further comprising a pull-up device, the pull-up device coupled to the signal pass subsystem, the pull-up device, the pull-down device, and the inverter.

* * * * *

UNITED STATES PATENT AND TRADEMARK OFFICE
CERTIFICATE OF CORRECTION

PATENT NO.: 6,005,432

DATED: December 21, 1999

INVENTORS: Xiaoyi Guo and Nalini Ranjan

It is certified that errors appear in the above-identified patent and that said Letters Patent is hereby corrected as shown below:

Column 16, line 55, replace "second level the" with --second level of the--.

Column 17, line 53, replace "seconds component" with -- second component--.

Signed and Sealed this

Twenty-fourth Day of October, 2000

*Attest:*

Q. TODD DICKINSON

*Attesting Officer*     *Director of Patents and Trademarks*